United States Patent
Spencer et al.

(10) Patent No.: US 8,722,530 B2
(45) Date of Patent: May 13, 2014

(54) METHOD OF MAKING A DIE WITH RECESSED ALUMINUM DIE PADS

(75) Inventors: Gregory S. Spencer, Pflugerville, TX (US); Phillip E. Crabtree, Austin, TX (US); Dean J. Denning, Del Valle, TX (US); Kurt H. Junker, Austin, TX (US); Gerald A. Martin, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 15 days.

(21) Appl. No.: 13/192,976

(22) Filed: Jul. 28, 2011

(65) Prior Publication Data

US 2013/0029485 A1    Jan. 31, 2013

(51) Int. Cl.
| | |
|---|---|
| *H01L 23/48* | (2006.01) |
| *H01L 33/62* | (2010.01) |
| *H01L 21/768* | (2006.01) |
| *H01L 23/488* | (2006.01) |

(52) U.S. Cl.
CPC .............................. *H01L 21/76804* (2013.01)
USPC ........... 438/620; 438/612; 438/622; 438/631; 438/688; 257/E23.02; 257/E23.037; 257/E23.174

(58) Field of Classification Search
CPC ........................ H01L 21/768; H01L 21/76885
USPC ................ 438/597–601, 605–608, 620, 622, 438/625–627, 629, 631, 637–639, 642–643, 438/645, 648, 650, 652–653, 565, 658, 438/666–669, 687, 688; 257/E23.02, 257/E23.037, E23.04, E21.59
See application file for complete search history.

(56) References Cited

U.S. PATENT DOCUMENTS

| | | | |
|---|---|---|---|
| 5,391,517 A | 2/1995 | Gelatos et al. | |
| 5,470,789 A | 11/1995 | Misawa | |
| 5,821,168 A * | 10/1998 | Jain | 438/692 |
| 6,146,985 A * | 11/2000 | Wollesen | 438/618 |
| 6,187,680 B1 | 2/2001 | Costrini et al. | |
| 6,218,302 B1 * | 4/2001 | Braeckelmann et al. | 438/687 |
| 6,255,151 B1 * | 7/2001 | Fukuda et al. | 438/197 |
| 6,329,722 B1 | 12/2001 | Shih et al. | |
| 6,346,479 B1 * | 2/2002 | Woo et al. | 438/687 |
| 6,420,254 B1 * | 7/2002 | Stamper et al. | 438/612 |
| 6,444,544 B1 * | 9/2002 | Hu et al. | 438/467 |
| 6,451,681 B1 * | 9/2002 | Greer | 438/601 |
| 6,750,129 B2 * | 6/2004 | Yang et al. | 438/601 |
| 6,841,478 B2 | 1/2005 | McTeer | |
| 6,940,114 B2 * | 9/2005 | Oh et al. | 257/296 |
| 7,015,094 B2 * | 3/2006 | Lee | 438/253 |
| 7,335,986 B1 * | 2/2008 | Paek et al. | 257/723 |
| 7,422,979 B2 * | 9/2008 | Michaelson et al. | 438/643 |
| 8,008,781 B2 * | 8/2011 | Fillion et al. | 257/774 |
| 8,030,098 B1 * | 10/2011 | Liou et al. | 438/15 |

(Continued)

*Primary Examiner* — William F Kraig
*Assistant Examiner* — Maliheh Malek
(74) *Attorney, Agent, or Firm* — David G. Dolezal; Mary Jo Bertani

(57) ABSTRACT

A method for making a semiconductor device comprises forming an electrical interconnect layer, forming a first dielectric layer over the interconnect layer, forming an opening in the first dielectric layer over a first electrical interconnect of the interconnect layer, forming an aluminum layer over the first dielectric layer, etching the aluminum layer to form an aluminum die pad, forming a second dielectric layer over the aluminum die pad and the first dielectric layer, and forming a conductive via through the first and second dielectric layers to contact a second electrical interconnect of the interconnect layer.

19 Claims, 14 Drawing Sheets

(56) References Cited

U.S. PATENT DOCUMENTS

| | | | |
|---|---|---|---|
| 8,039,962 B2* | 10/2011 | Lee et al. | 257/758 |
| 8,193,086 B2* | 6/2012 | Letz et al. | 438/630 |
| 8,319,353 B1* | 11/2012 | Liou et al. | 257/779 |
| 8,405,223 B2* | 3/2013 | Yang | 257/774 |
| 2003/0183940 A1* | 10/2003 | Noguchi et al. | 257/767 |
| 2004/0099910 A1* | 5/2004 | Choe et al. | 257/347 |
| 2005/0074966 A1* | 4/2005 | Rhodes | 438/629 |
| 2005/0087859 A1* | 4/2005 | Chao et al. | 257/700 |
| 2005/0186801 A1* | 8/2005 | Uno et al. | 438/706 |
| 2006/0079025 A1* | 4/2006 | Kripesh et al. | 438/113 |
| 2006/0154483 A1* | 7/2006 | Chopra et al. | 438/687 |
| 2006/0199387 A1* | 9/2006 | Rhodes | 438/687 |
| 2007/0037394 A1* | 2/2007 | Su et al. | 438/687 |
| 2007/0145452 A1* | 6/2007 | Oh et al. | 257/306 |
| 2007/0194460 A1* | 8/2007 | Lee et al. | 257/781 |
| 2008/0001292 A1* | 1/2008 | Zelner et al. | 257/758 |
| 2008/0099885 A1* | 5/2008 | You et al. | 257/659 |
| 2008/0166877 A1* | 7/2008 | Kanki et al. | 438/687 |
| 2010/0006989 A1* | 1/2010 | Dalal et al. | 257/659 |
| 2010/0132994 A1* | 6/2010 | Fillion et al. | 174/261 |
| 2010/0244241 A1* | 9/2010 | Marimuthu et al. | 257/737 |
| 2010/0270674 A1* | 10/2010 | Zhu | 257/758 |
| 2011/0233702 A1* | 9/2011 | Takahashi et al. | 257/432 |
| 2011/0260248 A1* | 10/2011 | Smeys et al. | 257/347 |
| 2012/0104541 A1* | 5/2012 | Chiu | 257/508 |
| 2012/0261787 A1* | 10/2012 | Stamper | 257/506 |

* cited by examiner

METHOD OF MAKING A DIE WITH RECESSED ALUMINUM DIE PADS

BACKGROUND OF THE INVENTION

1. Field of the Invention

This invention relates to an electrical die with recessed aluminum die pads.

2. Description of the Related Art

Electrical die are die that include one or electrical devices. One example of an electrical die is a semiconductor die. A semiconductor die includes a semiconductor material and implements one or more semiconductor devices. In some examples, an electrical die can include a single electrical device such as a power transistor or capacitor, or multiple electrical devices such as those in a microprocessor implemented in a die.

Electrical die utilize aluminum die pads for providing external electrical connection to other electrical devices in a system that incorporates the die. Aluminum die pads can also be used for probe contact in testing the devices implemented in a die. In some systems, it may be useful to include devices on a planar surface of the die wherein the die pads have a top surface below the planar surface of the die.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

Figure 1:
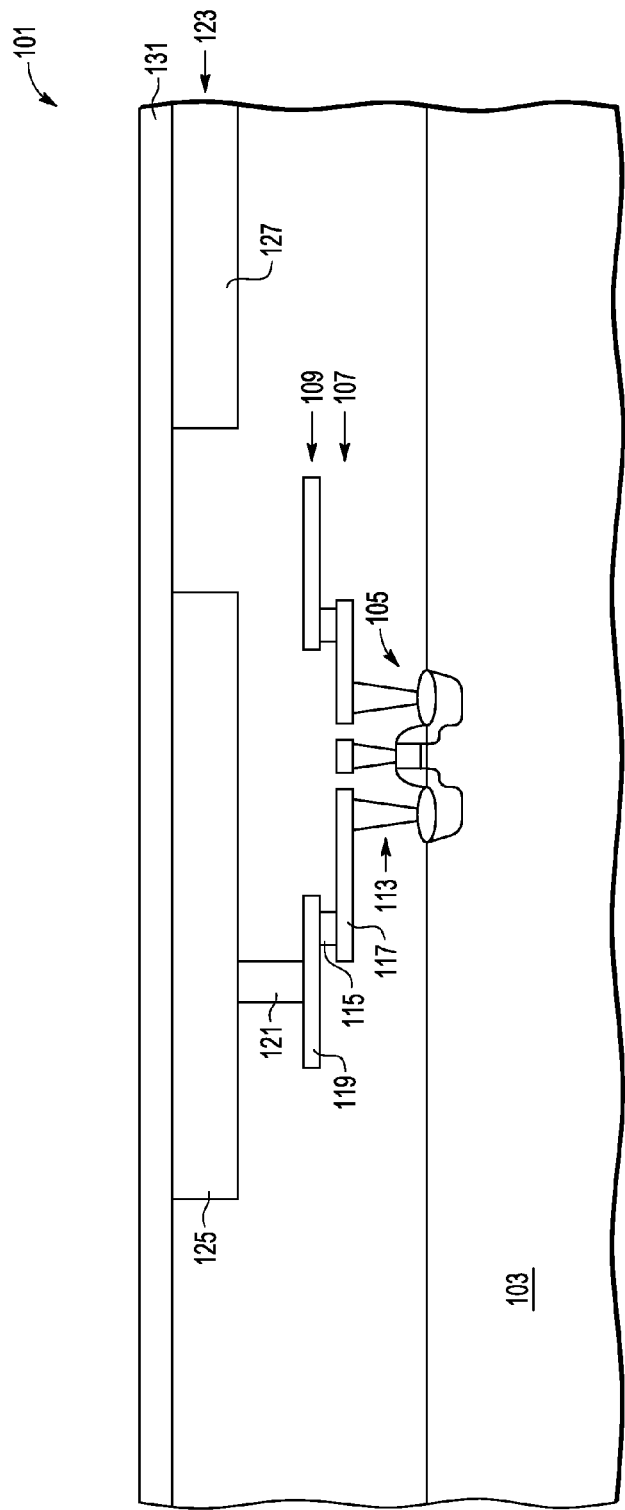
FIGS. 1-11 set forth partial cutaway side views of a wafer at various stages in forming an electrical die according to one embodiment of the present invention.

FIG. 1 shows a partial cutaway side view of a wafer 101 that is used to form an electrical die with an aluminum die pad that is recessed from a planar surface of the die. Wafer 101 includes a substrate 103 of a semiconductor material (e.g. silicon, silicon germanium, gallium nitride, gallium arsenide, other III-V semiconductor material). In the embodiment shown, substrate 103 has a bulk semiconductor configuration but may have other substrate configurations (e.g. a semiconductor on insulator configuration) in other embodiments.

Wafer 101 includes a plurality of semiconductor devices, with transistor 105 being shown in FIG. 1. In one embodiment, transistor 105 is a CMOS transistor formed on substrate 103 with a source, drain, and channel region located in substrate 103. However, wafer may include other types of semiconductor devices including other types of transistors (such as LDMOS, bipolar, HMFET, and biCMOS transistors), diodes, capacitors, and MEMS devices, as well as other types of electrical devices such as capacitors and inductors. The size of transistor 105 is not to scale in that it is significantly smaller than the other structures of wafer 101.

In the embodiment shown, wafer 101 includes interconnect layer 107, interconnect layer 109 and final interconnect layer 123. Each interconnect layer includes multiple electrical interconnects that electrically couple devices of the wafer to other devices of the wafer and to devices external to the wafer. For example, wafer 101 shows interconnects 125 and 127 in interconnect layer 123. The electrical interconnects of one interconnect layer may be electrically coupled to an interconnect of another layer by electrically conductive vias. For example, wafer 101 shows that interconnect 125 of interconnect layer 123 is electrically connected to via 121, which is electrically connected to interconnect 119 of layer 109, which is electrically connected to via 115, which is electrically connected to interconnect 117 of interconnect layer 107, which is electrically connected to via 113, which is electrically connected to a current terminal of transistor 105. In subsequent processes, interconnect 125 will be electrically coupled to an aluminum die pad.

In one embodiment, the electrical interconnects of an interconnect layer are formed by forming layers of interlevel dielectric material over wafer 101 and then forming openings in the dielectric material for the vias and for the interconnects. Afterwards, layers of conductive material are formed over the openings where the layers are then planarized to remove excess conductive material outside the openings. In other embodiments, the interconnects maybe be formed by forming a layer of conductive material and then patterning the layer of conductive material. Interlevel dielectric material is then formed over the wafer with patterned electrical interconnects and planarized. Electrical interconnects maybe formed by other methods in other embodiments.

In one embodiment, the interlevel dielectric material 129 is made of TEOS, oxides, carbon-doped oxide, nitride, silicon carbon nitride, oxynitrides, or combinations thereof. The conductive interconnects and vias are formed of conductive material such as copper, gold, aluminum, titanium, titanium nitride, other metals, or combinations thereof. In some embodiments, the conductive interconnects and vias include barrier layers (e.g. of titanium nitride, titanium, tantalum or tantalum nitride).

In the embodiment shown, interconnect layers 107 and 109 have a thickness that is about half the thickness of final interconnect layer 123. In one embodiment, the thicknesses of the lower layers is approximately 0.25 microns and the thickness of the final layer is 1 micron. However different die may have interconnect layers of different sizes in other embodiments. In some embodiments, the thicknesses of the interconnect layers increase with each subsequently added layer.

As shown in the FIG. 1, wafer 101 includes 3 interconnect layers, although other embodiments may include a different number of interconnect layers.

Passivation layer 131 is a layer of dielectric material that is deposited (e.g. by a CVD process) over wafer 101 after the last interconnect layer 123. In one embodiment, passivation layer 131 is made of up of a nitride layer and oxynitride layer formed there over, however layer 131 may be made of other materials in other embodiments. In one embodiment, layer 131 has a thickness of 0.5 microns as deposited, but may have other thicknesses in other embodiments.

Figure 2:
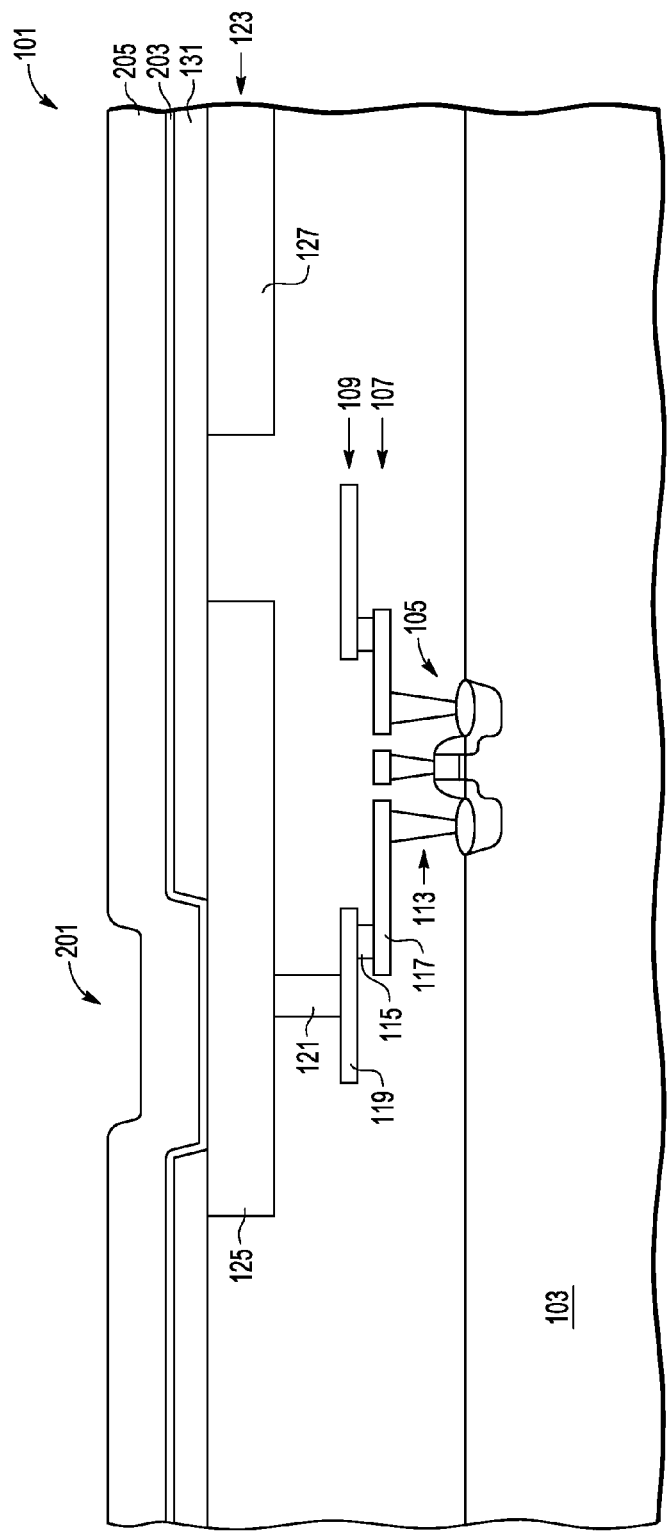

FIG. 2 is a partial cutaway side view of wafer 101 after an opening 201 is formed in passivation layer 131 to expose interconnect 125. In one embodiment, opening 201 is formed by a photo lithographic process where a layer of photo resist is formed over wafer 101 and patterned to form an opening therein. Layer 131 is then etched through the opening in the photo resist with an etchant that is selective to the material of interconnect 125. In one embodiment where interconnect 125 is made of copper, an etchant of $CHF_3CF_4$, and Ar may be used. However other types of etchants may be used in other embodiments.

In the embodiment shown, opening 201 is a single opening. However in other embodiments, opening 201 would be implemented with multiple, smaller openings in the general location of opening 201 wherein portions of layer 131 would be located in between the multiple openings.

After forming opening 201, a barrier layer 203 is formed over wafer 101 followed by a layer of an aluminum material. In one embodiment, layer 203 is made of tantalum, but may be made of other barrier materials e.g. titanium nitride. In one embodiment, layer 203 has a thickness in the range of 50-100 A but may have different thicknesses in other embodiments.

Layer 205 is a layer of aluminum material that will be used to form a die pad. As used herein an "aluminum layer" refers to a layer that includes at least 90% aluminum by atomic weight. An aluminum layer may include a layer of aluminum mixed with other materials or an aluminum alloy. In one embodiment, aluminum layer 205 is an alloy of 99.5% aluminum with 0.5% copper. However, other aluminum layers may have a different composition. As used herein, an "aluminum die pad" is a die pad with an aluminum layer.

In one embodiment, layer 205 is 1.2 microns thick and is deposited by a PVD (physical vapor deposition) process. However, an aluminum layer may have other thicknesses and/or may be deposited by other processes in other embodiments.

Figure 3:
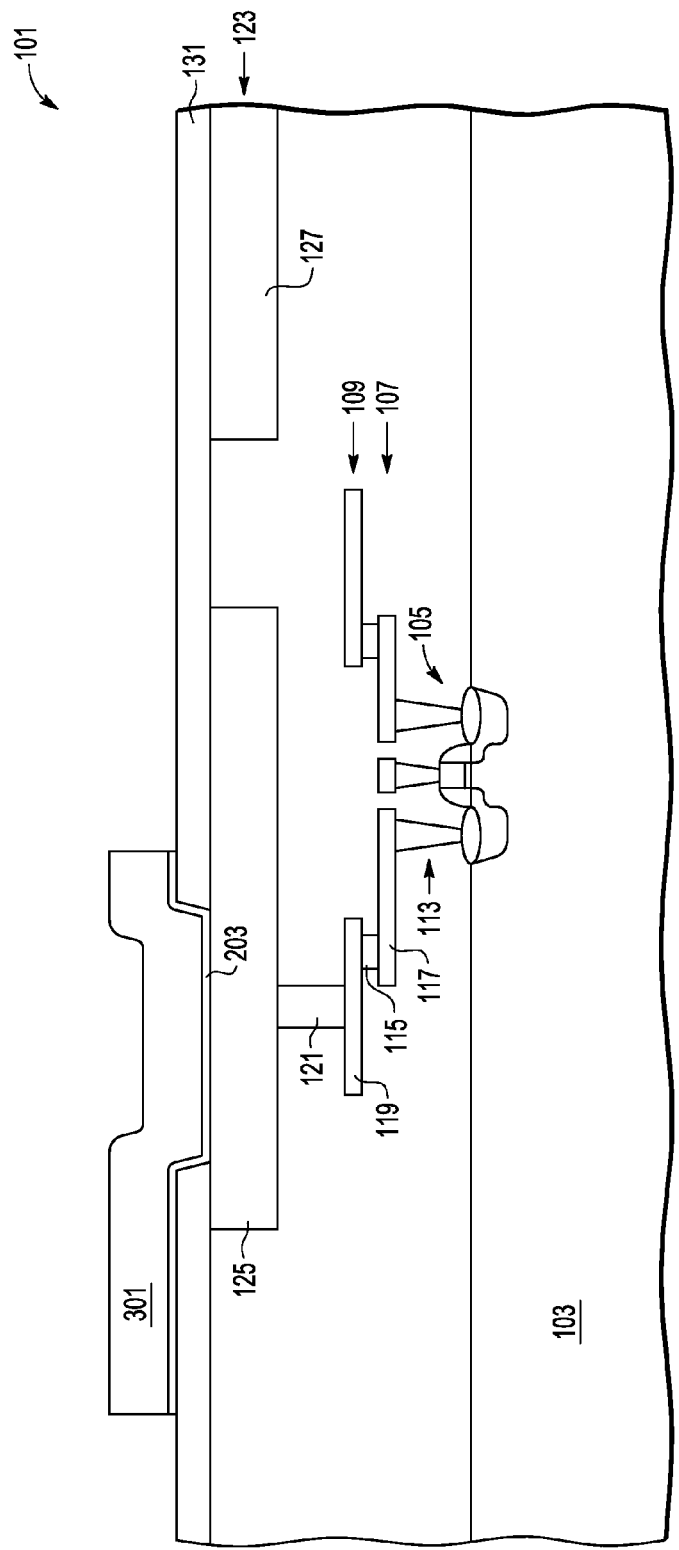

FIG. 3 shows a view of wafer 101 after aluminum layer 205 is patterned to form aluminum die pad 301. In one embodiment, layer 205 is patterned by a photolithographic process where a patterned photo resist mask is formed on layer 205 at the location of pad 301 in FIG. 3. The unwanted portions of layer 205 (and barrier layer 203) are removed with etchants of appropriate chemistries.

Figure 4:
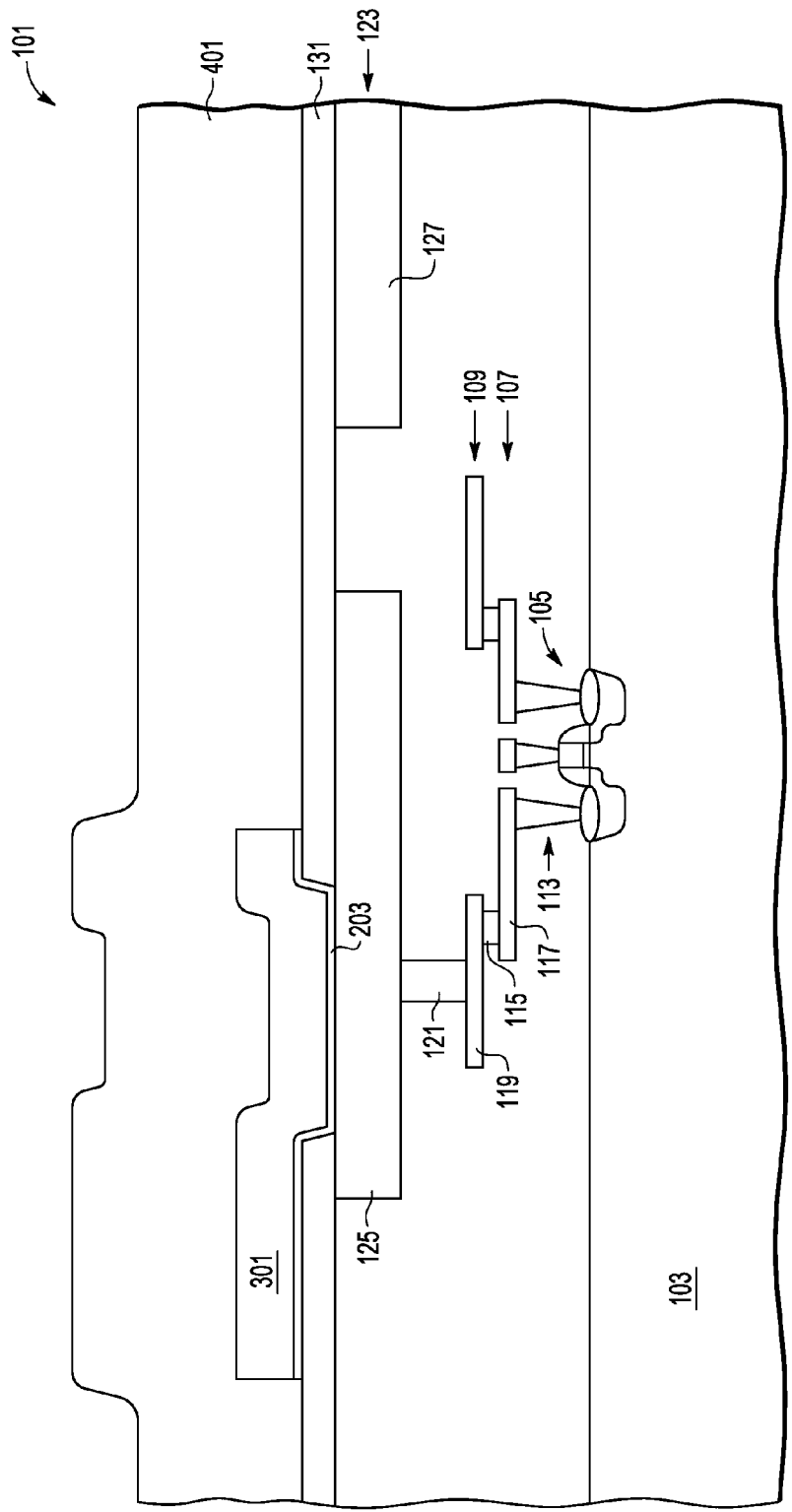

FIG. 4 is a view of wafer 101 after a dielectric layer 401 is deposited on wafer 101. In one embodiment, layer 401 is a conformal layer made of TEOS and is deposited by a plasma enhanced CVD process. However, layer 401 may be made by other materials (e.g. nitride, oxide, oxynitride) and/or may be formed by other processes in other embodiments. In one embodiment, layer 401 has a thickness of 2 microns as deposited. In one embodiment, layer is 401 is at least thick enough to where all of the top surface of layer 401 is above the highest top surface of aluminum die pad 301 so that layer 401 still covers all of pad 301 after planarization.

Although layer 401 is shown a conformal layer, in some embodiments, it may be a planarizing layer as deposited. For example, layer 401 may be a layer of spin on glass where the top surface of layer 401 has a more planar surface than what is shown in FIG. 4.

Figure 5:
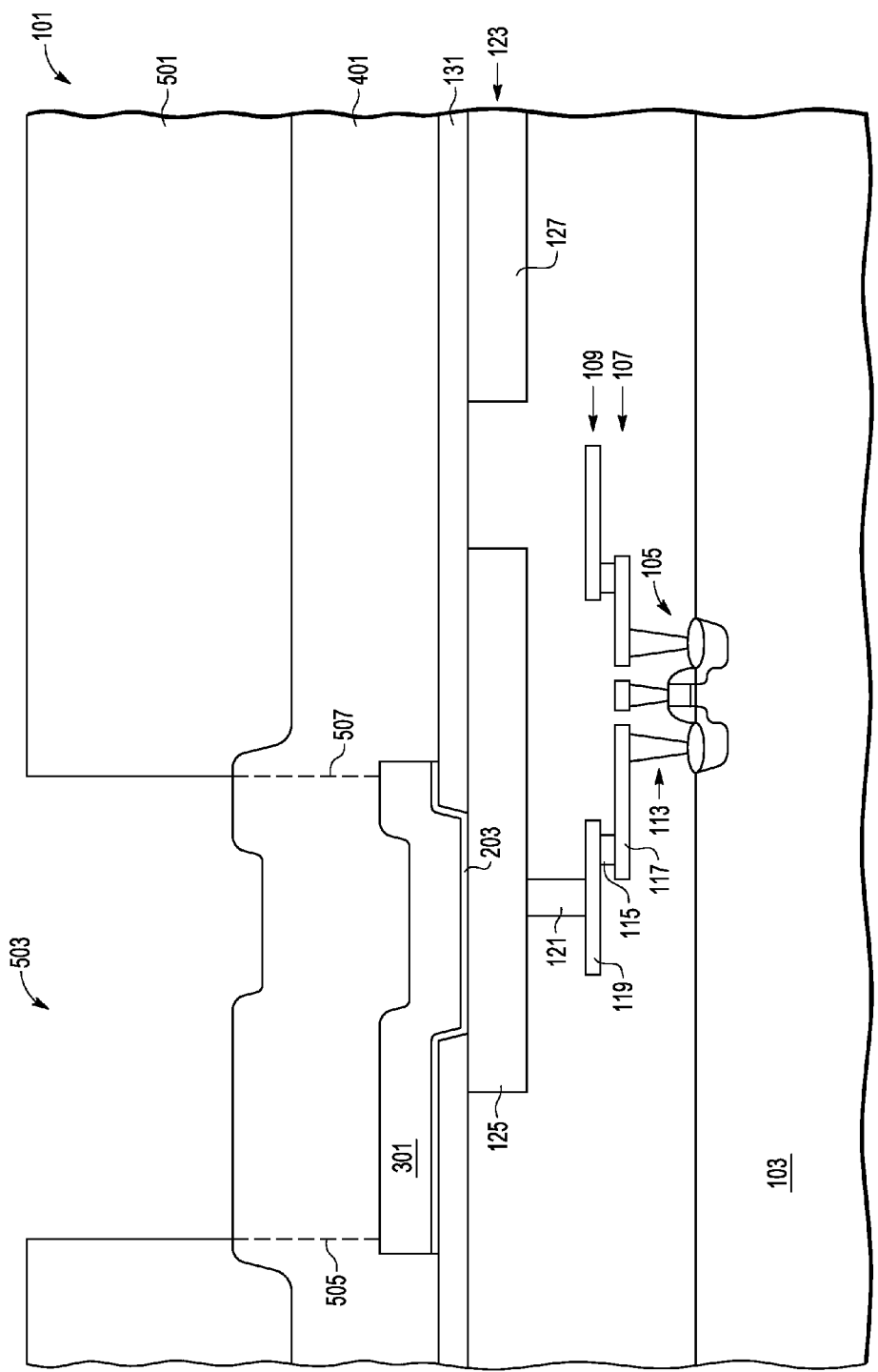

FIG. 5 shows a partial cutaway side view of wafer 101 after a photo resist mask 501 is formed over wafer 101 with an opening 503 over pad 301. Mask 501 is used for performing a timed etch on layer 401 so as to reduce the height of the portion of layer 401 over pad 301. This reduction in height by etching reduces the amount of material of layer 401 that will have to be planarized in a subsequent process. In one embodiment, mask 501 is a reverse mask of the mask used to form pad 301 except that opening 503 of mask 501 is slightly narrower (see dashed lines 507 and 505) than the width of aluminum die pad 301.

Figure 6:
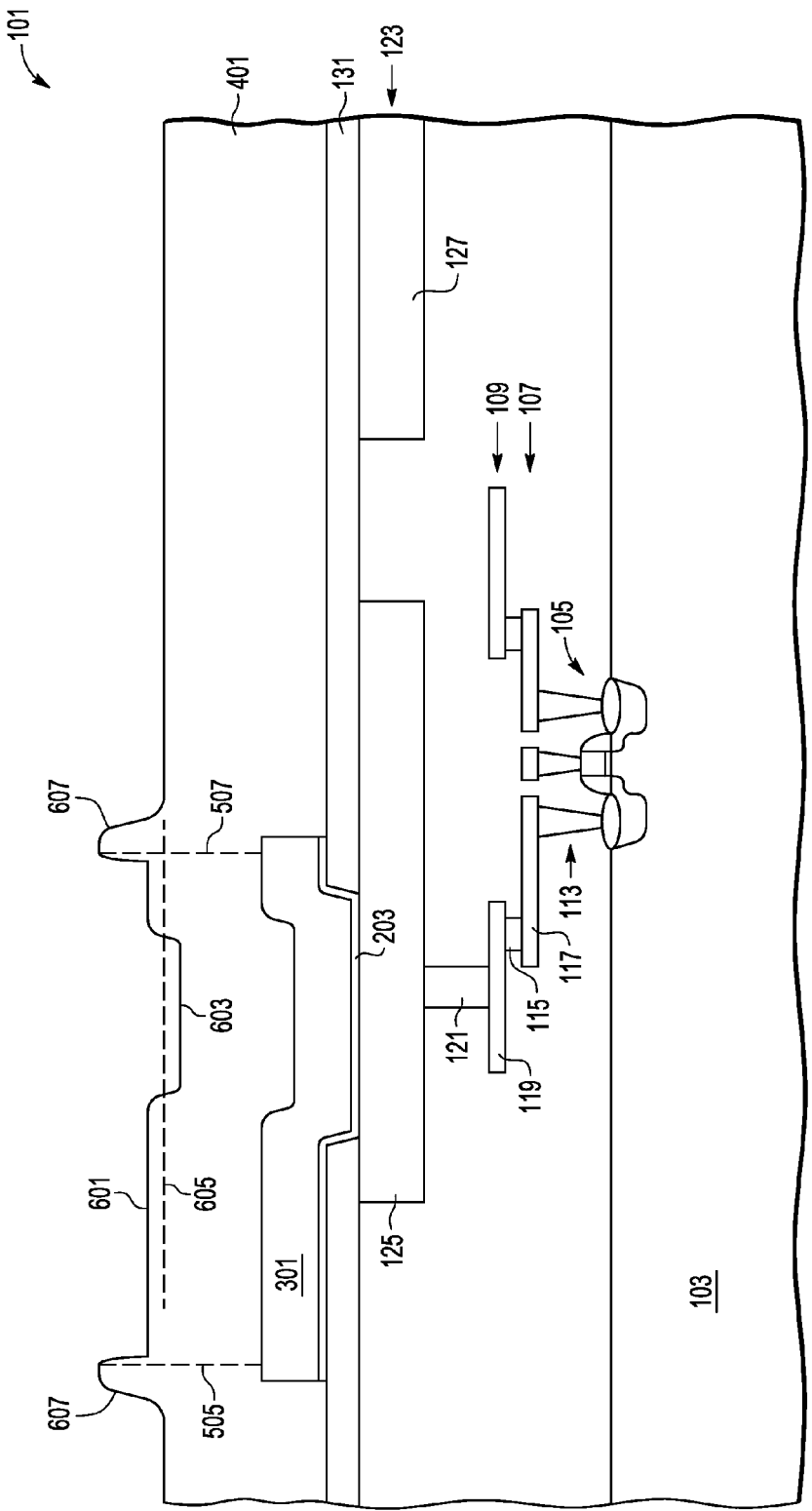

FIG. 6 shows wafer 101 after the top portion of layer 401 over pad 301 has been etched to reduce the height of layer 401. In one embodiment, layer 401 is etched with an etchant that includes $C_4F_8$, $CF_4$, $O_2$, and Ar. In the embodiment shown, because the width of the opening 503 of mask 501 is slightly less than the width of pad 301, a small raised portion 607 is left to ensure that "valleys" are not formed in layer 401 just outside of the area of pad 301.

In the embodiment shown, the timed etch of layer 401 is stopped at a location where the lower top surface 603 of layer 401 over pad 301 is located slightly below the level of the top surface (line 605) of the remaining portion of layer 401 and the higher top surface 601 of layer 401 is slightly above line 605. However, the stopping of the time etch can occur at other places.

The selective removal of the "high" spots of layer 401 over pad 301 with a selective etch (as shown in FIGS. 5 and 6) may provide for a reduction in surface variation on layer 401 after it has been subjected to a subsequent planarizing process. In some embodiments without this selective reduction, a planar surface may have a relatively greater surface variation due to the relatively large size of the aluminum die pad areas. Some embodiments do not include the selective etching of the top portion of conformal layer 401 over pad 301. Also where layer 401 is a planar layer as deposited (e.g. spin on glass), the selective etching may not be used.

Figure 7:
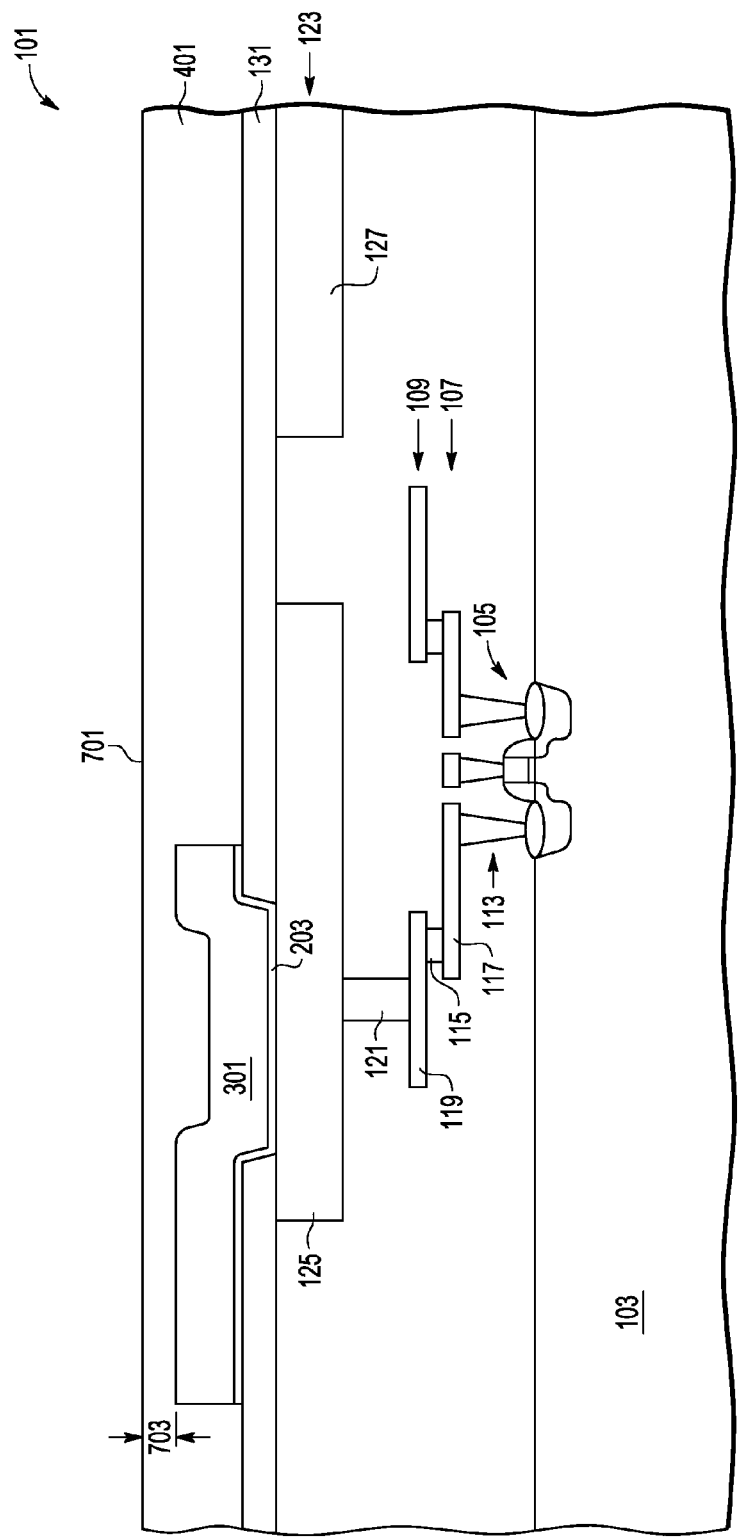

FIG. 7 shows wafer 101 after layer 401 has been planarized. In one embodiment, layer 401 is planarized with a CMP tool. In one embodiment, it is desirable that the planarized surface 705 be at least a specific distance from the top surface of pad 301 (as shown by dimension 703 in FIG. 7). In one embodiment, this distance is at least 0.1 micron, but may be of other distances in other embodiments.

In some embodiments, a polishing stop layer (not shown) may be deposited on surface 701. This polishing stop layer is used for protecting layer 401 during subsequent polishing steps. In one embodiment, the polishing stop layer is made of silicon oxynitride and has a thickness of 50-100 A, but may have other thicknesses and/or made of other materials in other embodiments.

Figure 8:
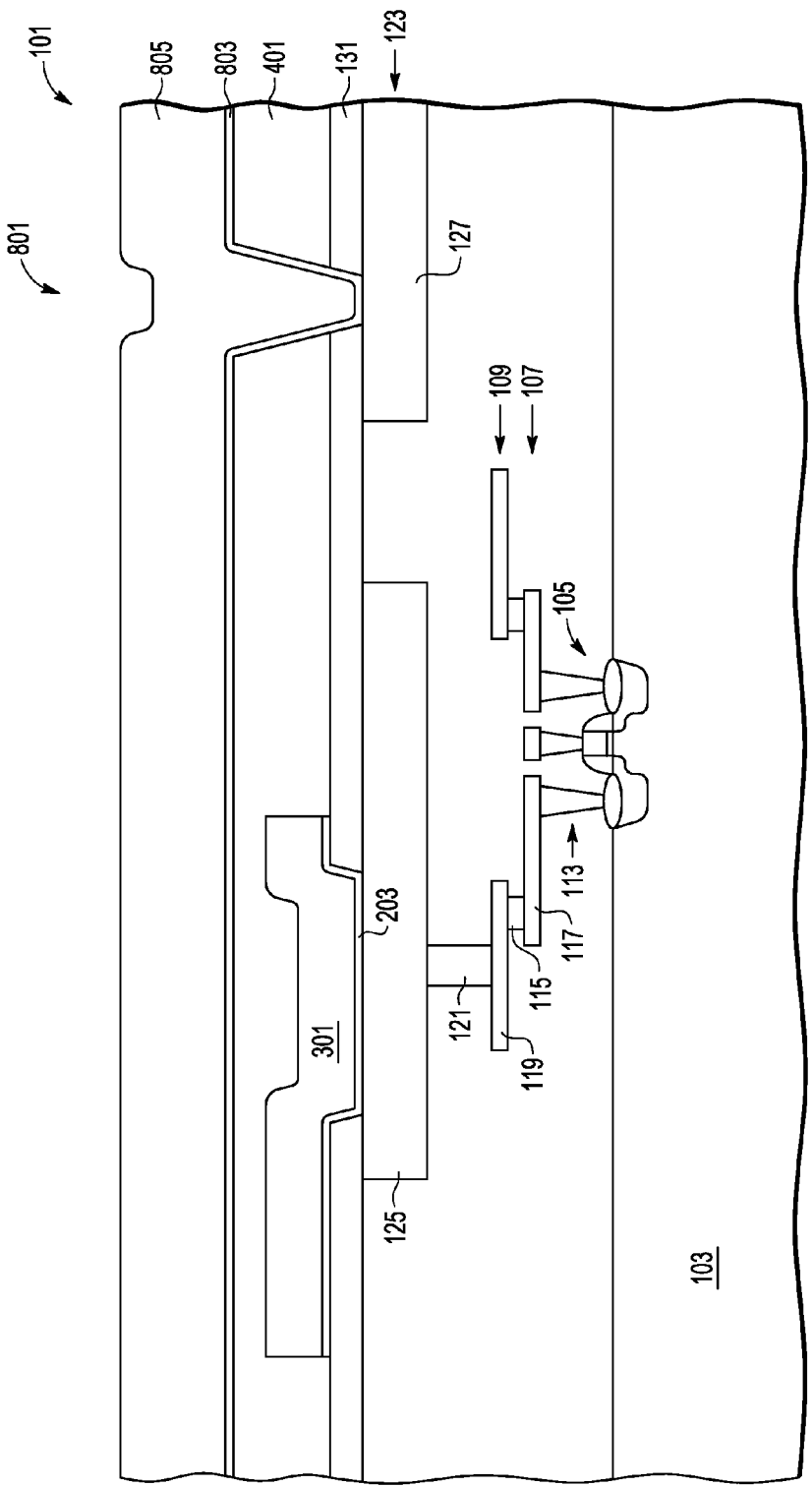

FIG. 8 shows wafer 101 after an opening 801 is formed in layer 401 and layer 131 for forming a conductive via to contact interconnect 127. Opening 801 is formed in layers 401 and 131 by a photolithographic process using the appropriate etch chemistries. In one embodiment, opening 801 has a 2 to 1 aspect ratio, but may have other aspect ratios in other embodiments. In some embodiments, via has a width of 0.5-1.2 microns, but may have other widths in other embodiments. In some embodiments, multiple openings may be made to expose interconnect 127 at the general location of opening 801. In some embodiments, opening 801 has a general circular configuration (as seen from a top view). However, in other embodiments, opening 301 may have other configurations such as a rectangular or an elongated trench configuration.

After the formation of the opening 801, a layer 803 of barrier material and a layer 805 of via material may be formed over wafer 101 to fill opening 801. In one embodiment, layer 803 is made of tantalum and tantalum nitride where layer 805 is copper. In another embodiments where layer 803 is made of titanium and titanium nitride where layer 805 is made of tungsten. In one embodiment, layer 803 has a thickness of 50-100 A, but may be of other thicknesses in other embodiments.

Layer 805 is made of a via material (e.g. copper, tungsten, or gold) and has a thickness to sufficiently fill opening 801. In one embodiment, layer 805 is deposited by a PVD process. In other embodiments, layer 805 is formed by a CVD process or electroplating.

Figure 9:
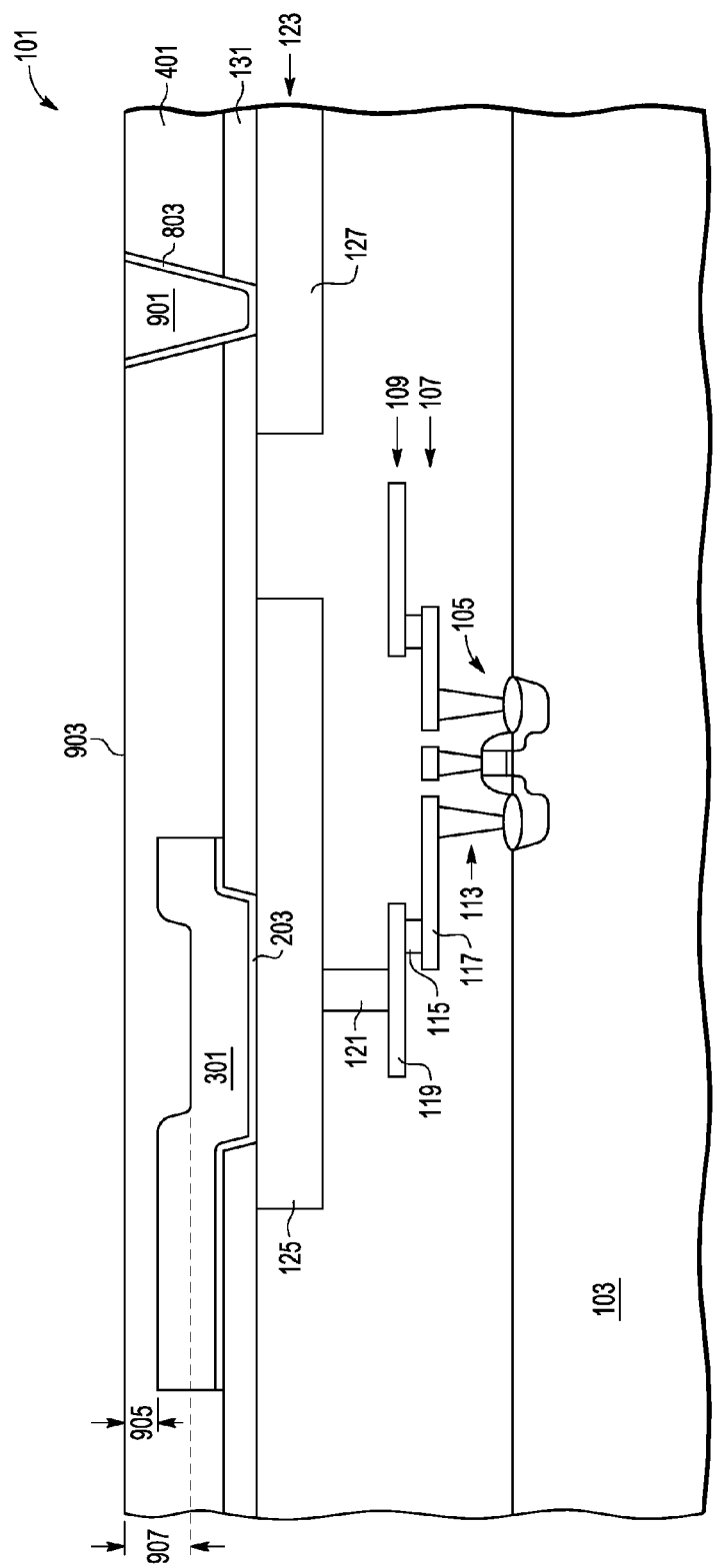

FIG. 9 shows wafer 101 after it has been polished to form planar surface 903 to remove the excess portions of layers 805 and 803 for forming conductive via 901. In one embodiment, the polishing of wafer 101 is performed until layer 401 is reached or until, in some embodiments, the polish stop layer (not shown) is reached.

Figure 10:
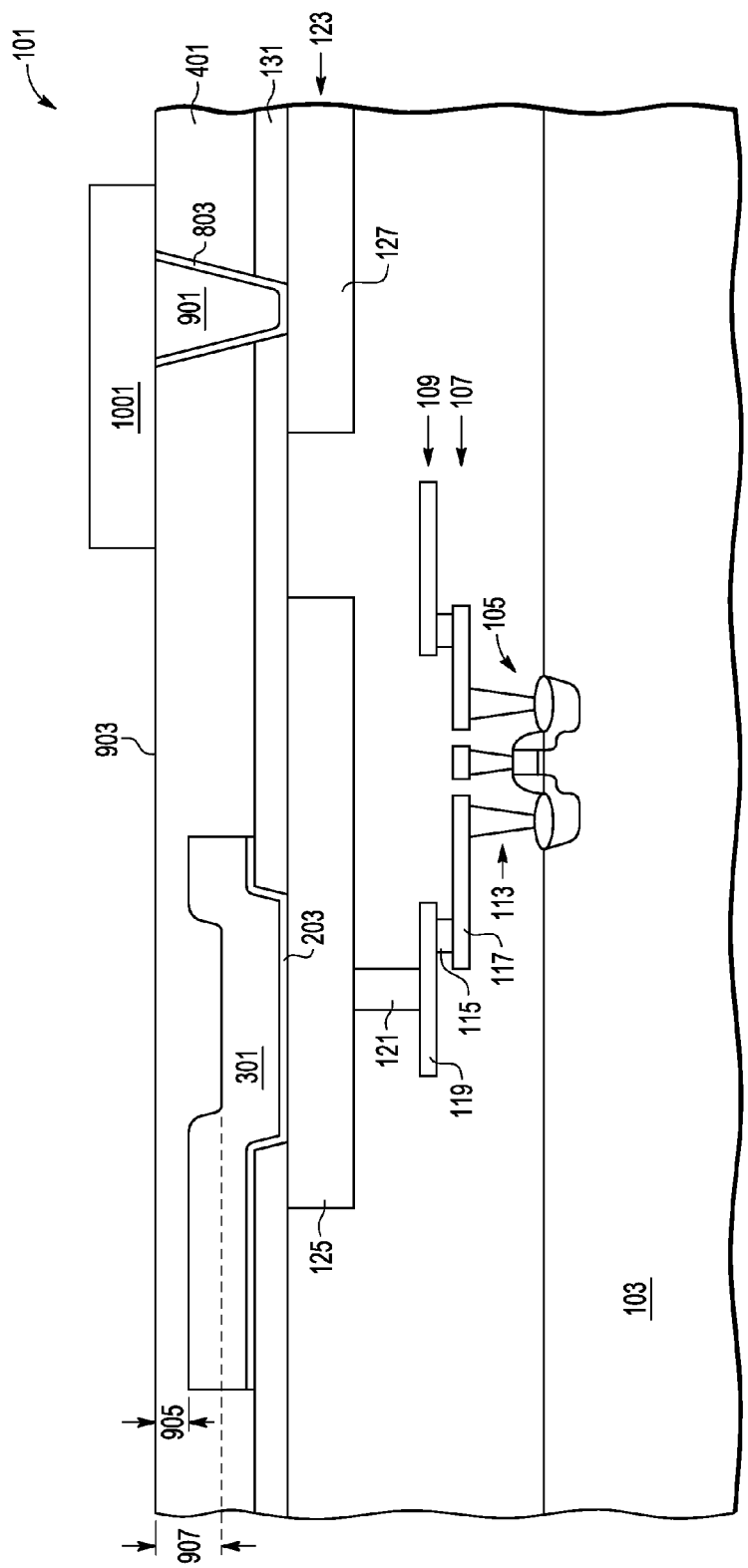

FIG. 10 shows wafer 101 after a structure 1001 is formed on planar surface 903. In one embodiment, structure 1001 is in electrical contact with via 901 or otherwise electrically coupled in some embodiments. Structure 1001 may be a device including multiple parts where one part of the device is electrically coupled to via 901 and the other parts are isolated. In other embodiments, structure 1001 is a passive device (capacitor or inductor) or a MEMS device. In one embodiment, structure 1001 is controllable by a signal or signals conveyed by via 901. In another embodiment, via 901 conveys a signal that indicates a parameter that is sensed by structure 1001. In one embodiment, structure 1001 is a reflective structure. In one embodiment, structure 1001 is a device that includes portions coupled to different interconnects in layer 131 with different vias similar to via 901. Also in other embodiments, multiple structures may be formed on surface 903 similar to structure 1001.

Figure 11:
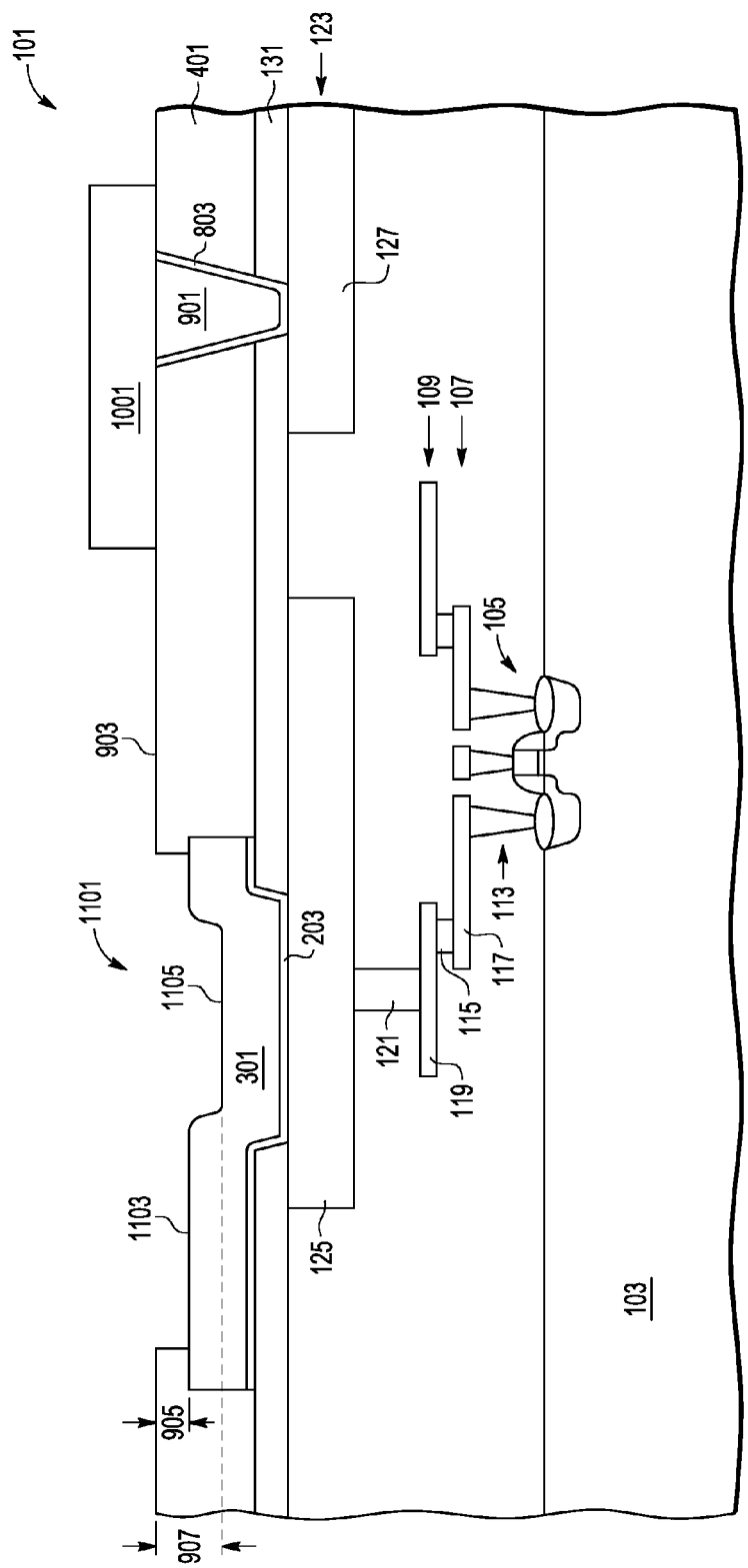
Figure 12:
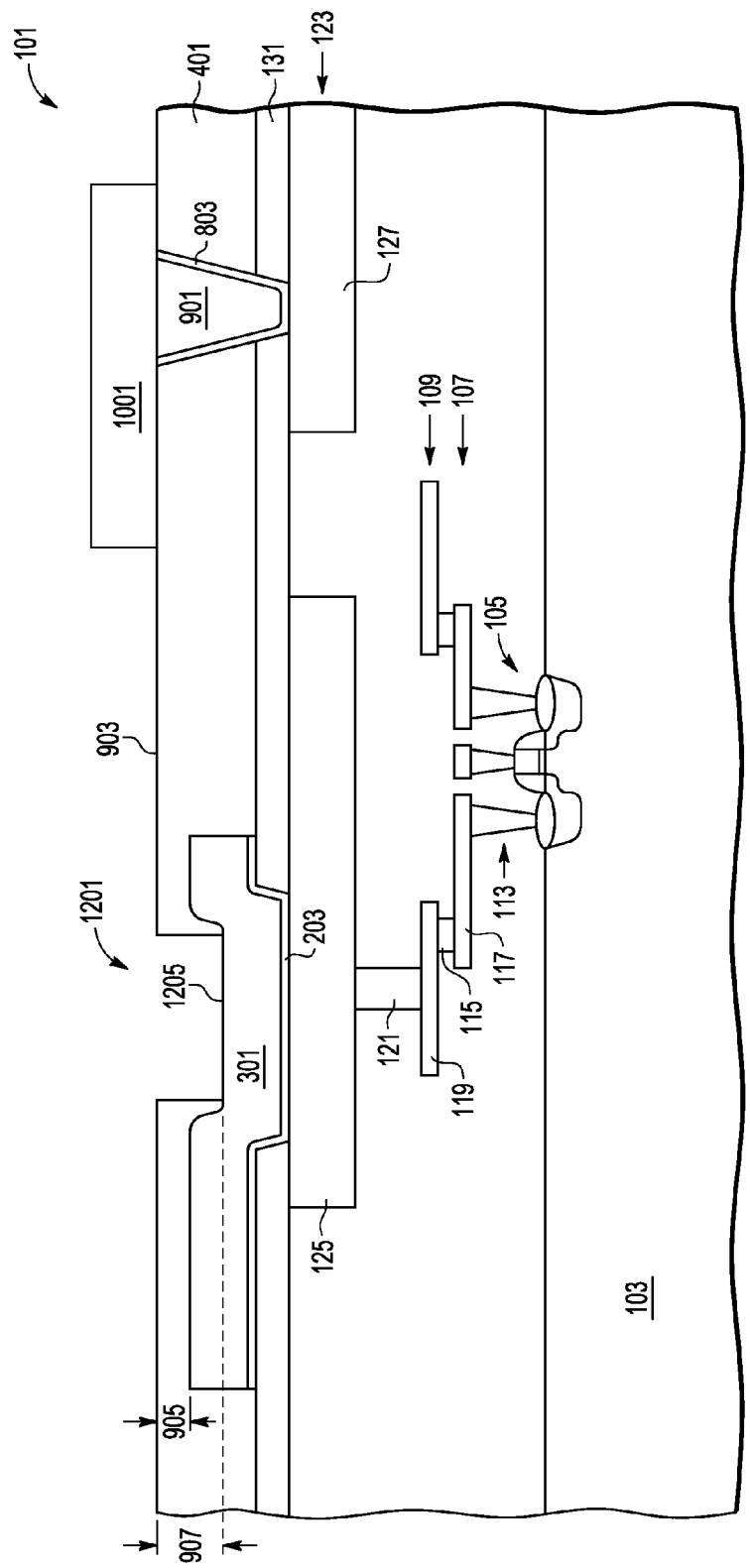
FIG. 12 sets forth a partial cutaway side view of a wafer at a stage in forming an electrical die according to another embodiment of the present invention.
Figure 13:
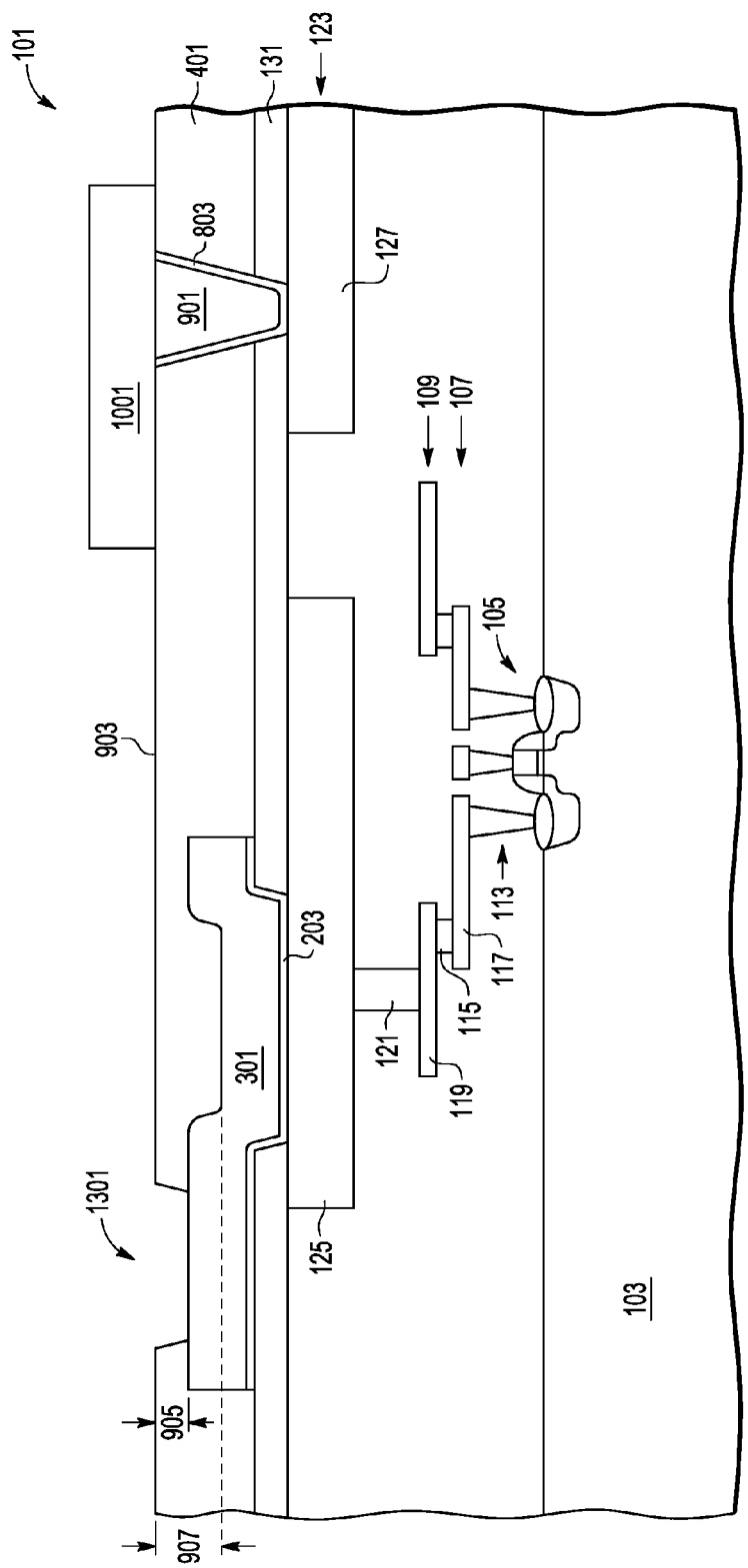
FIG. 13 sets forth a partial cutaway side view of a wafer at a stage in forming an electrical die according to another embodiment of the present invention.

FIGS. 11, 12, and 13 show three views of different embodiments of wafer 101 after an opening is formed in layer 401 to expose pad 301. In some embodiments, the openings are formed by a photolithographic process and with an etchant that is selective to the aluminum layer material.

In the embodiment of FIG. 11, opening 1101 exposes both the high portion 1103 and low portion 1105 of pad 301. The high portion 1103 is recessed by a distance 905 from planar surface 903 and low portion 1105 is recessed from planar surface 903 by distance 907. In some embodiments, portion 1103 is used for probe testing and portion 1105 is used for bonding to a solder ball or wire bond. However, the different portions may have different uses in other embodiments.

In FIG. 12, only the low portion 1205 is exposed by opening 1201. In FIG. 13, opening 1301 exposes only the upper portion of pad 1301.

After the stages of FIG. 11, 12, or 13, the wafer is singulated into multiple die with each die including at least one structure 1001 and recessed aluminum die pad 301. In some embodiments, a die may include multiple aluminum die pads similar to pad 301 and/or multiple structures similar to structure 1001. In one embodiment, the aluminum die pads may be located on one side of the die and the structures located on another side of the die.

After singulation, the die may be packaged in a packaging structure (e.g. in a flip chip, leaded, leadless, QFN package or other type of package) specific to the implementation of the die. In such a package, pad 301 is electrically coupled to a conductive structure. For example, a solder ball may be deposited in the recess to electrically couple aluminum die pad 301 to an external structure. In other embodiments, a wire bond may be attached to aluminum die pad 301. The particular type of packaging or subsequent processing would depend on how the device is to be utilized in a system.

In one embodiment, forming aluminum die pads that are recessed from a planar surface prior to the planarization of the surface may allow for a planar structure requiring a planar surface to be built on a device with aluminum die pads in an efficient process. In some embodiments, this device may be coupled with a via of a different material than the aluminum die pad. It may also allow for a reduced device topography.

In prior art methods where a recess is first formed in a planar surface and then the aluminum die pads are formed in the recess, difficulties exist in confining the die pad material to just the recessed area. With such prior art methods, it is difficult to remove the aluminum from the sidewalls of the recess while leaving the aluminum at the base of the recess. To do such may require the use of a photolithographic process which may not work well in the uneven topology of a recess. However with embodiments disclosed herein, the pad is formed prior to forming the recess in a planar surface which is located above the pad. Accordingly, patterning of an aluminum layer within the recess can be avoided.

Figure 14:
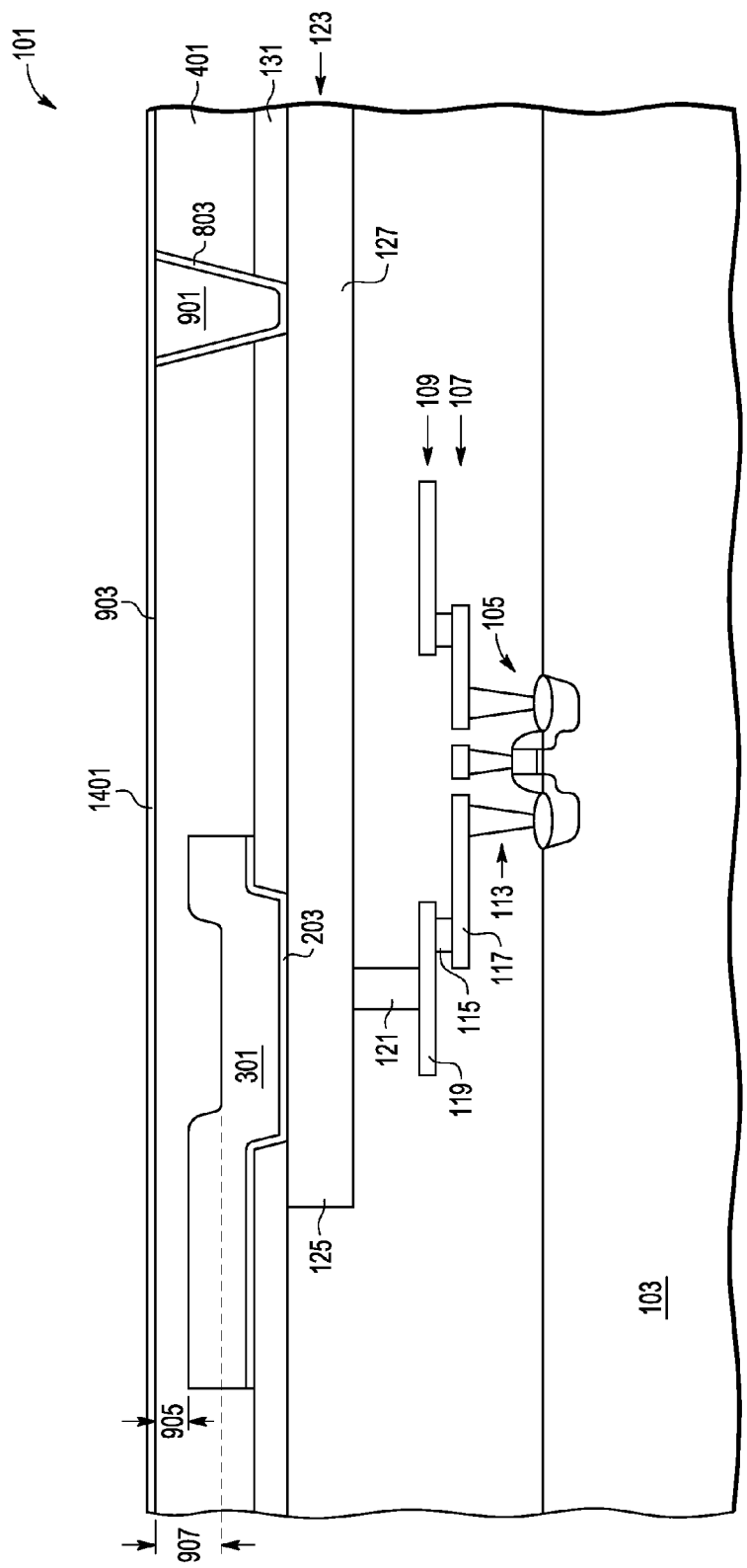
FIG. 14 sets forth a partial cutaway side view of a wafer at a stage in forming an electrical die according to another embodiment of the present invention.

FIG. 14 is a side cutaway view of another embodiment of wafer 101. In the embodiment of wafer 101, a passivation layer 1401 is formed on wafer 101 after the polishing to remove the excess via material. Passivation layer 1401 is a temporary layer for transporting the wafer to a subsequent processing area for further processing to build a structure on planar surface 903. Upon reaching the subsequent processing area, layer 1401 would be removed (e.g. with an appropriate etchant or by polishing). Afterwards a structure (e.g. 1001) may be formed on wafer 101 with at least a portion electrically coupled to via 901. In one embodiment, layer 1401 is made of a layer of oxynitride located over a layer of nitride. In one embodiment, layer 1401 is 500-1000 A thick, but may be made of other materials and have other thicknesses in other embodiments.

In the embodiment shown, interconnect 125 and interconnect 127 are electrically connected together to electrically couple via 901 to pad 301. With such an embodiment, pad 301 may be used to electrically couple a subsequently formed structure (e.g. such as structure 1001) to an external device.

In one embodiment, a method for making a semiconductor device includes forming an electrical interconnect layer, forming a first dielectric layer over the electrical interconnect layer, forming an opening in the first dielectric layer over a first interconnect of the electrical interconnect layer, forming an aluminum layer over the opening and the first dielectric layer, patterning the aluminum layer to form an aluminum die pad electrically coupled to the first interconnect of the electrical interconnect layer, forming a second dielectric layer with a planar surface over the aluminum die pad and the first dielectric layer, and forming a conductive via through the first dielectric layer and the second dielectric layer to electrically contact a second interconnect of the electrical interconnect layer.

In another embodiment, a method for making a semiconductor device includes forming an interconnect layer including a first electrical interconnect, forming a first dielectric layer over the interconnect layer, forming an opening in the first dielectric layer and over the first electrical interconnect of the interconnect layer, forming an aluminum layer in the opening and over the first dielectric layer, etching the aluminum layer to form an aluminum die pad over the first electrical interconnect. The aluminum die pad is electrically coupled to the first electrical interconnect. The method includes forming a second dielectric layer over the aluminum die pad and the first dielectric layer and planarizing the second dielectric layer to form a planar surface.

In another embodiment, a method for making a semiconductor device includes forming an electrical interconnect layer, forming a first dielectric layer over the electrical interconnect layer, forming an opening in the first dielectric layer over a first electrical interconnect of the electrical interconnect layer, forming an aluminum layer in the opening and over the first dielectric layer, and etching the aluminum layer to form an aluminum die pad. The aluminum die pad is electrically coupled to the first electrical interconnect. The method includes forming a second dielectric layer over the aluminum die pad and the first dielectric layer, and forming a conductive via through the first dielectric layer and the second dielectric layer to contact a second electrical interconnect of the electrical interconnect layer.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method for making a semiconductor device comprising:
    forming an electrical interconnect layer;
    forming a first dielectric layer over the electrical interconnect layer;
    forming an opening in the first dielectric layer over a first interconnect of the electrical interconnect layer;
    forming an aluminum layer over the opening and the first dielectric layer;
    patterning the aluminum layer to form an aluminum die pad electrically coupled to the first interconnect of the electrical interconnect layer;
    forming a second dielectric layer with a planar surface over the aluminum die pad and the first dielectric layer;
    forming a conductive via through the first dielectric layer and the second dielectric layer to electrically contact a second interconnect of the electrical interconnect layer;
    after forming the conductive via, forming an opening in the second dielectric layer to expose at least a portion of the aluminum die pad, wherein a top surface of the aluminum die pad is at a level that is below a top surface of the conductive via.

2. The method of claim 1 wherein the forming a second dielectric layer with a planar surface includes forming the second dielectric layer and then planarizing the second dielectric layer.

3. A method for making a semiconductor device comprising:
    forming an electrical interconnect layer;
    forming a first dielectric layer over the electrical interconnect layer;
    forming an opening in the first dielectric layer over a first interconnect of the electrical interconnect layer;
    forming an aluminum layer over the opening and the first dielectric layer;
    patterning the aluminum layer to form an aluminum die pad electrically coupled to the first interconnect of the electrical interconnect layer;
    forming a second dielectric layer with a planar surface over the aluminum die pad and the first dielectric layer;
    forming a conductive via through the first dielectric layer and the second dielectric layer to electrically contact a second interconnect of the electrical interconnect layer;
    wherein the forming a second dielectric layer with a planar surface includes forming the second dielectric layer and then planarizing the second dielectric layer; before planarizing the second dielectric layer, forming a layer of photo resist over the second dielectric layer; forming an opening in the layer of photo resist to the second dielectric layer above an inner area of the aluminum die pad; and etching the second dielectric layer, wherein the etching results in a raised portion of the second dielectric layer around at least a portion of the inner area of the aluminum die pad.

4. The method of claim 1 further comprising:
    forming a transistor on a substrate, the transistor is located below the electrical interconnect layer.

5. The method of claim 1 further comprising:
    forming at least one electrical interconnect layer, the at least one electrical interconnect layer is located below the electrical interconnect layer.

6. The method of claim 1 further comprising:
    bonding an electrically conductive structure to the aluminum die pad after forming the conductive via.

7. The method of claim 1 wherein:
    the aluminum die pad extends over sides of the opening in the first dielectric layer.

8. The method of claim 1 further comprising:
    forming a structure over the conductive via and electrically coupled to the conductive via.

9. The method of claim 1 wherein:
    a top surface of the conductive via is coplanar with the planar surface of the second dielectric layer or a planar surface above the planar surface of the second dielectric layer.

10. The method of claim 1 wherein the first interconnect and the second interconnect are electrically coupled.

11. The method of claim 3 further comprising:
    after forming the conductive via, forming an opening in the second dielectric layer to expose at least a portion of the aluminum die pad, wherein a top surface of the aluminum die pad is at a level that is below a top surface of the conductive via.

12. A method for making a semiconductor device comprising:
    forming an interconnect layer including a first electrical interconnect;
    forming a first dielectric layer over the interconnect layer;
    forming an opening in the first dielectric layer and over the first electrical interconnect of the interconnect layer;
    forming an aluminum layer in the opening and over the first dielectric layer;
    etching the aluminum layer to form an aluminum die pad over the first electrical interconnect, the aluminum die pad electrically coupled to the first electrical interconnect;
    forming a second dielectric layer over the aluminum die pad and the first dielectric layer; and
    planarizing the second dielectric layer to form a planar surface;
    forming a conductive via through the first dielectric layer and the second dielectric layer to electrically contact a second electrical interconnect of the interconnect layer;
    after forming the conductive via, forming an opening in the second dielectric layer to expose at least a portion of the aluminum die pad, wherein a to surface of the aluminum die pad is at a level that is below a to surface of the conductive via.

13. The method of claim 3 wherein a top surface of the aluminum die pad is at a level that is below a top surface of the conductive via.

14. The method of claim 12 wherein:
    the forming an opening in the second dielectric layer to expose at least a portion of the aluminum die pad is performed after the planarizing the second dielectric layer.

15. The method of claim 12 further comprising:
forming a transistor on a substrate, the transistor is located below the interconnect layer;
forming a plurality of interconnect layers, the plurality of interconnect layers is located between the substrate and the interconnect layer; and
forming a barrier layer over the first dielectric layer and the opening in the first dielectric layer before forming the aluminum layer.

16. The method of claim 12 wherein:
the aluminum die pad extends over sides of the opening in the first dielectric layer.

17. The method of claim 12 further comprising:
forming a structure over the planar surface;
wherein the forming an opening in the second dielectric layer to expose at least a portion of the aluminum die pad is performed after forming the structure.

18. A method for making a semiconductor device comprising:
forming an electrical interconnect layer;
forming a first dielectric layer over the electrical interconnect layer;
forming an opening in the first dielectric layer over a first electrical interconnect of the electrical interconnect layer;
forming an aluminum layer in the opening and over the first dielectric layer;
etching the aluminum layer to form an aluminum die pad, the aluminum die pad electrically coupled to the first electrical interconnect;
forming a second dielectric layer over the aluminum die pad and the first dielectric layer; and
forming a conductive via through the first dielectric layer and the second dielectric layer to contact a second electrical interconnect of the electrical interconnect layer;
after forming the conductive via, forming an opening in the second dielectric layer to expose at least a portion of the aluminum die pad, wherein a to surface of the aluminum die pad is at a level that is below a to surface of the conductive via.

19. The method of claim 18 further comprising:
planarizing the second dielectric layer; and
after the planarizing, forming a stop layer over the second dielectric layer.

* * * * *